(12) United States Patent
Lee (10) Patent No.: US 9,012,249 B2
(45) Date of Patent: Apr. 21, 2015

(54) ORGANIC LIGHT EMITTING DIODE DISPLAY AND METHOD FOR MANUFACTURING THE SAME

(71) Applicant: Samsung Display Co., Ltd, Yongin, Gyeonggi-Do (KR)

(72) Inventor: Kyung-Jun Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 43 days.

(21) Appl. No.: 13/860,890

(22) Filed: Apr. 11, 2013

(65) Prior Publication Data

US 2013/0237116 A1 Sep. 12, 2013

Related U.S. Application Data

(62) Division of application No. 12/801,463, filed on Jun. 9, 2010, now Pat. No. 8,445,923.

(30) Foreign Application Priority Data

Jul. 21, 2009 (KR) .................. 10-2009-0066525

(51) Int. Cl.
*H01L 21/00* (2006.01)
*H05B 33/04* (2006.01)
*H01L 51/52* (2006.01)
*H01L 27/32* (2006.01)

(52) U.S. Cl.
CPC .............. *H05B 33/04* (2013.01); *H01L 51/525* (2013.01); *H01L 27/3246* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 6,175,345 B1 | 1/2001 | Kuribayashi et al. |
| 7,088,418 B1 | 8/2006 | Yamashita et al. |
| 7,253,868 B2 | 8/2007 | Lee et al. |
| 7,859,635 B2 | 12/2010 | Yokoyama et al. |
| 8,045,126 B2 | 10/2011 | Kim et al. |
| 2005/0140290 A1 | 6/2005 | Park et al. |
| 2005/0140291 A1 | 6/2005 | Hirakata et al. |
| 2005/0179377 A1 | 8/2005 | Shitagami et al. |

(Continued)

FOREIGN PATENT DOCUMENTS

| | | |
|---|---|---|
| JP | 2001194655 | 7/2001 |
| JP | 2003140159 | 5/2003 |
| JP | 2005158617 | 6/2005 |

(Continued)

*Primary Examiner* — Benjamin Sandvik
(74) *Attorney, Agent, or Firm* — Robert E. Bushnell, Esq.

(57) ABSTRACT

An organic light emitting diode display comprises a display substrate including an organic light emitting element, an encapsulation substrate disposed to face the display substrate, a sealant disposed between edges of the display substrate and the encapsulation substrate for bonding and sealing the display substrate and the encapsulation substrate together, a filler filling in a space between the display substrate and the encapsulation substrate, first spacers formed on one surface of the display substrate contacting the filler, and second spacers formed on one surface of the encapsulation substrate contacting the filler. The display substrate and the encapsulation substrate are divided into a dropping area and a spreading area surrounding the dropping area and positioned relatively close to the sealant, and either or both of the first spacers and the second spacers have different shapes in the dropping area and in the spreading area.

10 Claims, 9 Drawing Sheets (56) References Cited

U.S. PATENT DOCUMENTS

| | | |
|---|---|---|
| 2007/0121054 A1 | 5/2007 | Jang et al. |
| 2009/0039778 A1 | 2/2009 | Tomita |
| 2010/0171416 A1 | 7/2010 | Lee |
| 2011/0221334 A1 | 9/2011 | Kwon et al. |

FOREIGN PATENT DOCUMENTS

| | | |
|---|---|---|
| JP | 2005166315 | 6/2005 |
| JP | 2005250502 | 9/2005 |
| JP | 2007042467 | 2/2007 |
| JP | 2007156221 | 6/2007 |
| KR | 1020020031251 | 5/2002 |
| KR | 1020040078037 | 9/2004 |

ORGANIC LIGHT EMITTING DIODE DISPLAY AND METHOD FOR MANUFACTURING THE SAME

CLAIM OF PRIORITY

This Divisional application makes reference to, incorporates the same herein, and claims all benefits accruing under 35 U.S.C. §119 from an application earlier filed in the Korean Intellectual Property Office on the 21$^{st}$ of Jul. 2009 and there duly assigned Ser. No. 10-2009-0066525. Furthermore, this application is filed pursuant to 35 U.S.C. §121 as a Divisional application of Applicants' patent application Ser. No. 12/801,463 filed in the U.S. Patent & Trademark Office on 9 Jun. 2010, and assigned to the assignee of the present invention. All benefits accruing under 35 U.S.C. §120 from the aforesaid present application Ser. No. 12/801,463 are also claimed.

BACKGROUND OF THE INVENTION

1. Field of the Invention

The present invention relates generally to an organic light emitting diode display and a method for manufacturing the same and, more particularly, to an organic light emitting diode display which improves durability and suppresses the generation of defects, and a method for manufacturing the same.

2. Description of the Related Art

Organic light emitting diode (OLED) displays have a self-emissive characteristic. Therefore, unlike liquid crystal displays, OLED displays do not require a separate light source, and thus their thickness and weight can be reduced. Furthermore, OLED displays have a variety of desirable properties, such as low power consumption, high luminance, quick response, and the like. Therefore, OLED displays are drawing attention as upcoming alternative displays for portable electronic devices.

In general, an organic light emitting display includes a display substrate having an organic light emitting element, an encapsulation substrate disposed to face the display substrate and covering the organic light emitting element of the display substrate, and a sealant for bonding and sealing the display substrate and the encapsulation substrate display substrate together. However, the mechanical strength of the organic light emitting diode display is weak due to the presence of a void between the display substrate and the encapsulation substrate.

To solve this problem, a filler is filled in the space between the display substrate and the encapsulation substrate by a vacuum bonding method to thereby improve durability against external impact.

However, if the space between the display substrate and the encapsulation substrate is filled with a filler, the filler comes in contact with the sealant formed along edges of the display substrate and encapsulation substrate. In this procedure, the filler exerts a negative effect on the curing process of the sealant to thereby make the sealant defective. Therefore, the sealant cannot stably bond and seal the display substrate and the encapsulation substrate.

The above information disclosed in this Background section is only for enhancement of understanding of the background of the invention, and therefore it may contain information that does not form the prior art which is already known in this country to a person of ordinary skill in the art.

SUMMARY OF THE INVENTION

The described technology has been made in an effort to solve the above-mentioned problems occurring in the background art, and to provide an organic light emitting diode display which stably improves durability and suppresses the generation of defects.

Furthermore, the present invention provides a method for manufacturing the above organic light emitting diode display.

An organic light emitting diode display according to an exemplary embodiment comprises: a display substrate including an organic light emitting element; an encapsulation substrate disposed to face the display substrate; a sealant disposed between edges of the display substrate and the encapsulation substrate for bonding and sealing the display substrate and the encapsulation substrate together; a filler filling in a space between the display substrate and the encapsulation substrate; first spacers formed on one surface of the display substrate contacting the filler; and second spacers formed on one surface of the encapsulation substrate contacting the filler; wherein the display substrate and the encapsulation substrate are divided into a dropping area and a spreading area surrounding the dropping area and positioned relatively close to the sealant, and either or both of the first spacers and the second spacers have different shapes in the dropping area and in the spreading area.

The filler may be dropped first in the dropping area and spread out to the spreading area.

The first spacers and the second spacers may each be formed as a bar type with a length in a direction parallel to the display substrate and the encapsulation substrate, respectively, and the first spacers and the second spacers may be arranged in directions crossing each other.

The second spacers may be longer in the dropping area than in the spreading area.

The first spacers may be longer in the dropping area than in the spreading area.

The first spacers and the second spacers may be longer in the dropping area than in the spreading area.

Either or both of the first spacers and the second spacers formed in the spreading area may become gradually shorter from the dropping area.

A pair of first spacers and a pair of second spacers may be arranged in a rectangular shape in the dropping area, and the middle portion of the second spacer may be positioned between a pair of the first spacers neighboring in a longitudinal direction in the spreading area.

The organic light emitting element of the display substrate may display an image through a plurality of pixels emitting light, and the first spacers may be arranged in parallel with the short sides of pixels and the second spacers may be arranged in parallel with the long sides of the pixels.

The first spacers may have a length that is less than or equal to that of the short sides of pixels, and the second spacers may have a length that is less than or equal to that of the long sides of the pixels.

Furthermore, a method for manufacturing an organic light emitting diode display comprises: forming first spacers on a display substrate; forming second spacers on an encapsulation substrate; forming a sealant on edges of either or both of the display substrate and the encapsulation substrate; dropping a filler on any one of the display substrate and the encapsulation substrate; and bonding the display substrate and the encapsulation substrate together with the sealant and the filler interposed therebetween; wherein the display substrate and the encapsulation substrate are divided into a dropping area and a spreading area surrounding the dropping area and positioned relatively close to the sealant, either or both of the first spacers and the second spacers have different shapes in the dropping area and in the spreading area, and the filler is dropped in the dropping area and spread out to the spreading area along with the bonding of the display substrate and the encapsulation substrate.

The first spacers and the second spacers may each be formed as a bar type with a length in a direction parallel to the display substrate and the encapsulation substrate, respectively, and the first spacers and the second spacers may be arranged in directions crossing each other.

The second spacers may be longer in the dropping area than in the spreading area.

The first spacers may be longer in the dropping area than in the spreading area.

The first spacers and the second spacers may be longer in the dropping area than in the spreading area.

Either or both of the first spacers and the second spacers formed in the spreading area may become gradually shorter from the dropping area.

A pair of first spacers and a pair of second spacers may be arranged in a rectangular shape in the dropping area, and the middle portion of the second spacer may be positioned between a pair of the first spacers neighboring in a longitudinal direction in the spreading area.

The organic light emitting element of the display substrate may display an image through a plurality of pixels emitting light, and the first spacers may be arranged in parallel with the short sides of pixels and the second spacers may be arranged in parallel with the long sides of the pixels.

The first spacers may have a length that is less than or equal to that of the short sides of pixels, and the second spacers may have a length that is less than or equal to that of the long sides of the pixels.

The method may further include curing the sealant in a state in which the display substrate and the encapsulation substrate are bonded together.

According to the present invention, the organic light emitting diode display can stably improve durability against impact and effectively suppress the generation of a defective sealed condition.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, various exemplary embodiments will be described in detail with reference to the accompanying drawings so that those skilled in the art can readily carry out the invention. As those skilled in the art will realize, the described embodiments may be modified in various different ways, all without departing from the spirit or scope of the present invention.

For various exemplary embodiments, constituent elements having the same constitution are designated by the same reference numerals and are explained representatively in the first exemplary embodiment. In the other exemplary embodiments, only constituent elements that are different from those of the first exemplary embodiment are described.

In order to clarify the present invention, parts that are not related to descriptions are omitted, and the same or similar elements are given the same reference numerals throughout the specification.

Furthermore, the sizes and thicknesses of the elements shown in the drawings are arbitrarily shown for convenience of description, and thus the present invention is not necessarily limited to the illustrated ones.

In the drawings, thicknesses are magnified in order to clearly depict the plurality of layers and regions. In the drawings, the thickness of some of the layers and regions are exaggerated for clarity. It will be understood that, when an element such as a layer, film, region, or substrate is referred to as being "on" another element, it can be directly on the other element or intervening elements may also be present.

In addition, in the attached drawings, although an active matrix (AM) type of organic light emitting diode display having a 2TR-1Cap structure, which includes two thin film transistors (TFTs) and one capacitor for one pixel, is illustrated, the present invention is not limited thereto. Accordingly, the organic light emitting diode display may include three or more TFTs and two or more capacitors in one pixel. The organic light emitting display may have various structures with additional wiring. Here, a pixel refers to a minimum unit for displaying an image, and the organic light emitting diode display displays an image through a plurality of pixels.

Hereinafter, a first exemplary embodiment will be described with reference to FIGS. 1 and 2.

Figure 1:
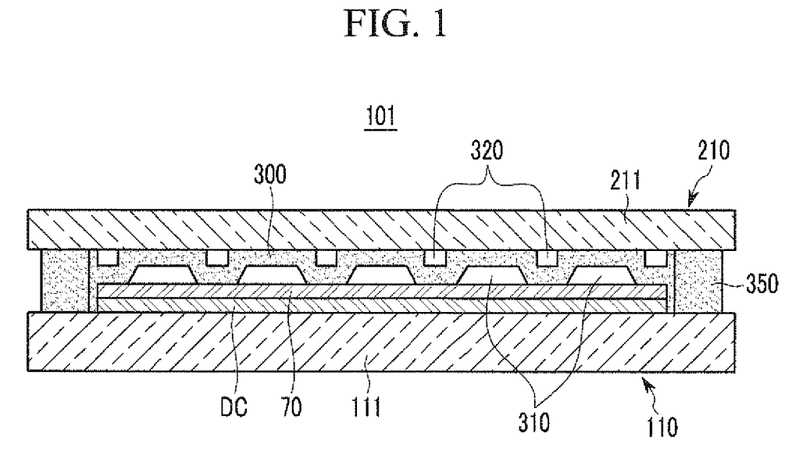
FIG. 1 is a cross-sectional view of an organic light emitting diode display according to a first exemplary embodiment.
Figure 2:
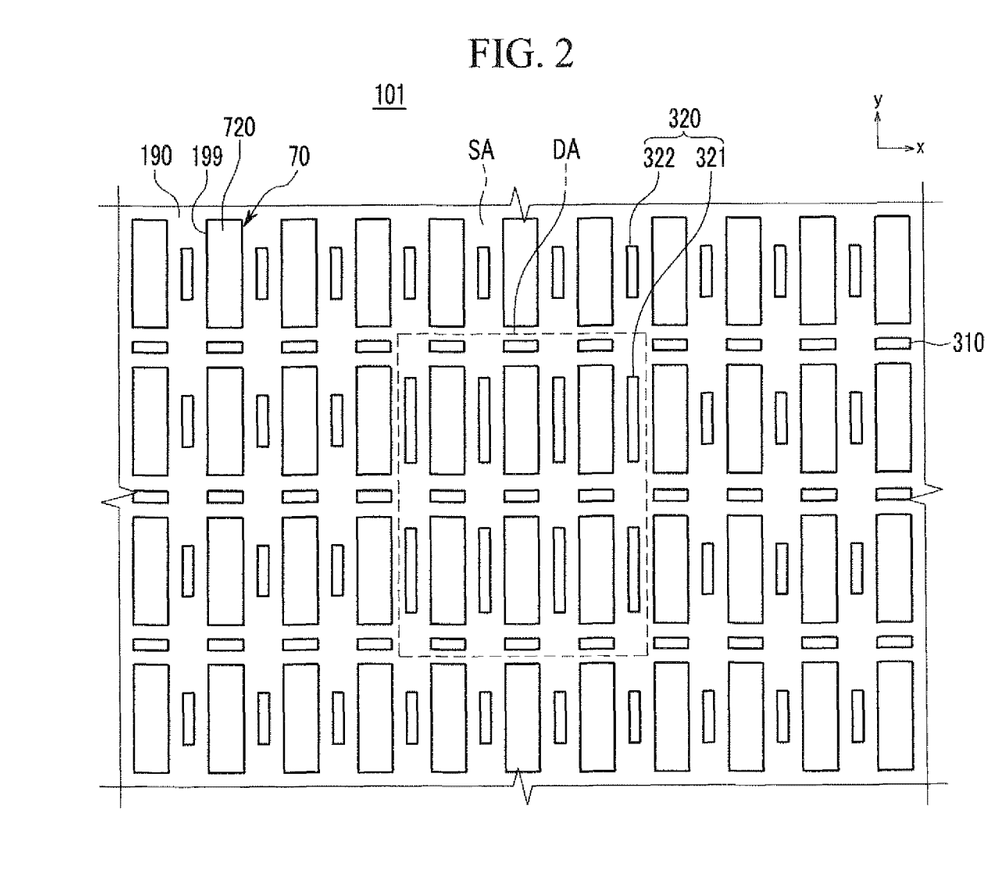
FIG. 2 is a plan view showing the organic light emitting diode display of FIG. 1.

FIG. 1 is a cross-sectional view of an organic light emitting diode display according to a first exemplary embodiment and FIG. 2 is a plan view showing the organic light emitting diode display of FIG. 1.

As shown in FIG. 1, an organic light emitting diode display 101 according to the first exemplary embodiment includes a display substrate 110, an encapsulation substrate 210, a first spacer 310, a second spacer 320, a sealant 350, and a filler 300.

The display substrate 110 includes a first substrate body 111, and a driving circuit DC and an organic light emitting element 70 formed on the first substrate body 111.

The first substrate body 111 may be formed of an insulating substrate made of glass, quartz, ceramic, plastic, or the like. However, the first exemplary embodiment is not limited thereto, and the first substrate body 111 may be formed of a metallic substrate made of stainless steel or the like.

The driving circuit DC includes thin film transistors 10 and 20 (shown in FIG. 4), and drives the organic light emitting element 70. The organic light emitting element 70 emits light in accordance with a driving signal transmitted from the driving circuit DC to display an image.

Figure 4:
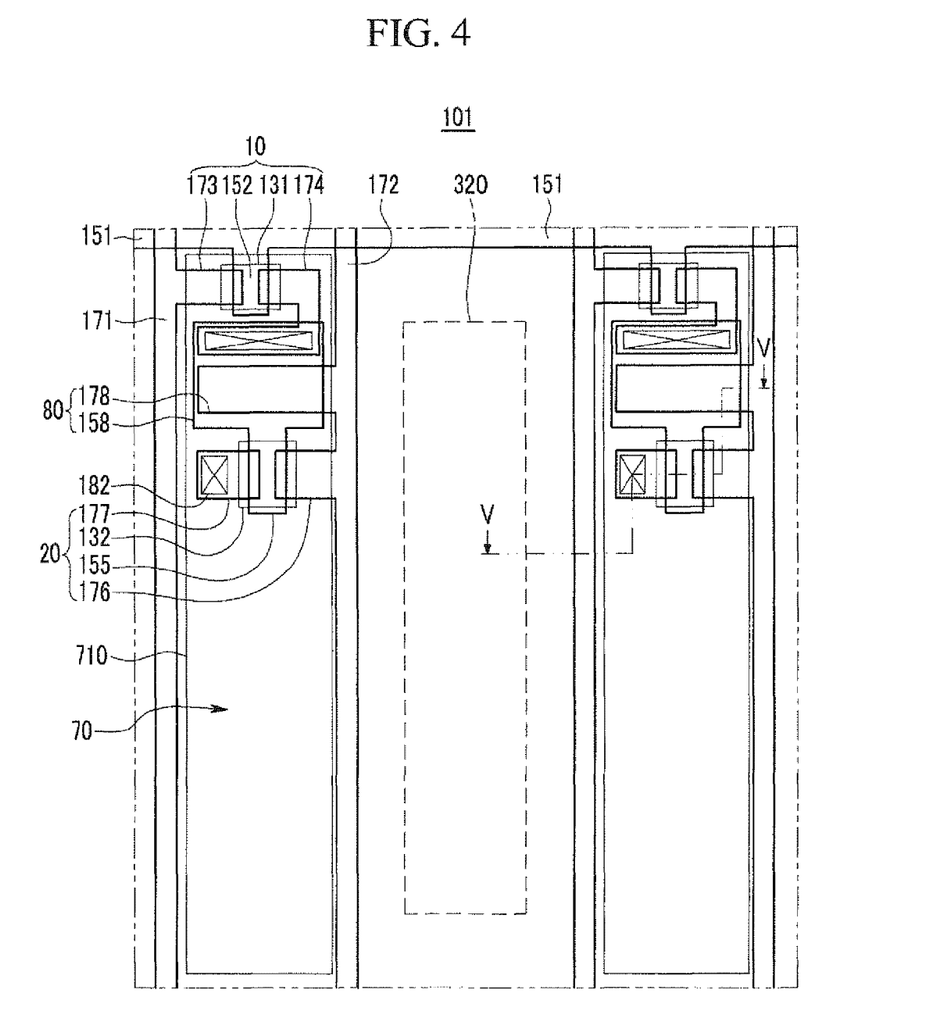
FIG. 4 is an enlarged layout view showing an internal structure of the organic light emitting diode display of FIG. 1.
Figure 5:
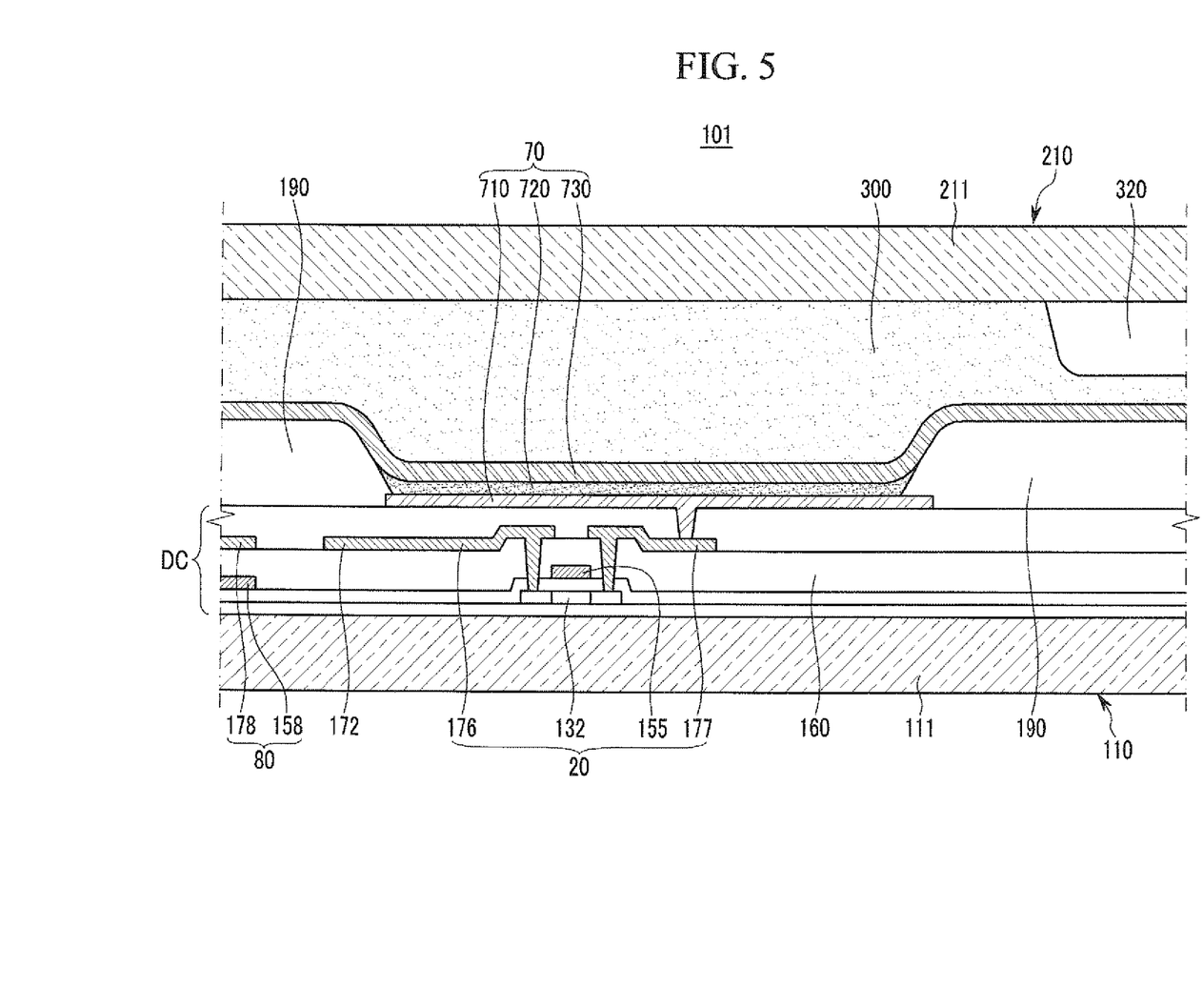
FIG. 5 is a cross-sectional view taken along line V-V of FIG. 4.

Although detailed structures of the organic light emitting element 70 and driving circuit DC are shown in FIGS. 4 and 5, the first exemplary embodiment is not limited to the structures illustrated in FIGS. 4 and 5. The organic light emitting element 70 and the driving circuit DC may be formed in various structures within the range in which those skilled in the art can readily make modifications.

The encapsulation substrate 210 is disposed to face the display substrate 110, and covers the organic light emitting element 70 and driving circuit DC of the display substrate 110. The encapsulation substrate 210 includes a second substrate body 211 formed of a transparent material such as glass, plastic, or the like.

The sealant 350 is disposed between edges of the display substrate 110 and the encapsulation substrate 210 to bond and seal the display substrate 110 and the encapsulation substrate 210 together. The sealant 350 may be made of various known materials, and is cured by a method such as heat curing or UV curing.

The filler 300 is disposed between the display substrate 110 and the encapsulation substrate 210 to fill a gap between the display substrate 110 and the encapsulation substrate 210. Further, the filler 300 may be made of a resin material, a liquid crystal material, or various other known materials.

The filler 300 improves the mechanical strength of the organic light emitting diode display 101 by filling in a void between the display substrate 110 and the encapsulation substrate 210. That is, the inside of the organic light emitting diode display 101 is filled with the filler 300, thus improving durability against external impact.

First spacers 310 are formed on one surface of the display substrate 110 contacting the filler 300. In addition, second spacers 320 are formed on one surface of the encapsulation substrate 210 contacting the filler 300. The first spacers 310 and the second spacers 320 are formed in bar shapes that have a length in a direction parallel to the display substrate 110 and the encapsulation substrate 210, respectively. In addition, the first spacers 310 and the second spacers 320 are arranged in directions crossing each other when the display substrate 110 and the encapsulation substrate 210 are bonded together.

In addition, an organic light emitting element 70 of the display substrate 110 is disposed for each pixel to emit light. As shown in FIG. 2, the display substrate 110 further includes a pixel defining film 190, and the pixel defining film 190 has a plurality of openings 199 defining a light emitting region of the organic light emitting element 70. That is, the organic light emitting element 70 emits light from a light emitting layer 720 in the openings 199. Further, the first spacers 310 are arranged in parallel with the short sides of pixels, and the second spacers 320 are arranged in parallel with the long sides of the pixels. In other words, the first spacers 310 are disposed between the short sides of neighboring pixels, and the second spacers 320 are disposed between the long sides of the neighboring pixels. However, the first exemplary embodiment is not limited thereto. Therefore, the first spacers 310 may be arranged in parallel with the long sides of pixels, and the second spacers 320 may be arranged in parallel with the short side of the pixels.

In addition, the first spacers 310 have a length that is less than or equal to that of the short sides of pixels, and the second spacers 320 have a length that is less than or equal to that of the long sides of the pixels.

In addition, the first spacers 310 and the second spacers 320 may be made of various known materials, such as a polyacrylate resin, a polyimide resin, and an inorganic silica material.

In addition, the display substrate 110 and the encapsulation substrate 210 are divided into a dropping area DA and a spreading area SA surrounding the dropping area DA and positioned relatively close to the sealant 350. In the first exemplary embodiment, the length of the second spacers 320 in a direction parallel to the encapsulation substrate 210 is larger in the dropping area DA than in the spreading area SA. That is, the second spacers 322 of the spreading area SA are shorter than the second spacers 321 of the dropping area DA.

Additionally, a pair of first spacers 310 and a pair of second spacers 320 may be arranged in a rectangular shape to surround a pixel.

In the process of bonding the display substrate 110 and the encapsulation substrate 210 together with the filler 300 interposed therebetween, the filler 300 spreads out to the spreading area SA, starting from the dropping area DA at which the filler 300 is dropped at an initial stage. At this time, the first spacers 310 and second spacers 320 of the dropping area DA control the spread and flow of the filler 300. Particularly, the second spacers 321 of the dropping area DA are longer than the second spacers 322 of the spreading area SA to thereby suppress the spread and flow of the filler 300 relatively more in the dropping area DA than in the spreading area SA. Further, as the second spacers 322 of the spreading area SA are shorter than the second spacers 321 of the dropping area DA, the filler 300 can be spread more smoothly in the spreading area SA than in the dropping area DA. In this manner, the first spacers 310 and second spacers 320 of the dropping area DA serve as a dam for confining the filler 300 and suppress a negative effect on the curing process of the sealant 350 that is caused as the filler 300 starting to be dropped first in the dropping area DA contacts the sealant 350 too quickly.

In addition, the display substrate 110 is formed as a rectangle having a pair of long sides and a pair of short sides. In the first exemplary embodiment, the long sides of the pixels are disposed in parallel with the short sides of the display substrate 110, and the short sides of the pixels are disposed in parallel with the long sides of the display substrate 110. In other words, the first spacers 310 are arranged in parallel with the long sides of the display substrate 110, and the second spacers 320 are arranged in parallel with the short sides of the display substrate 110.

Furthermore, since the dropping area DA is positioned at the center of the display substrate 110 formed in a rectangular shape, it takes different times for the filler 300, starting to be dropped first in the dropping area DA and spread out, to reach the long sides and short sides, respectively, of the display substrate 110. That is, the filler 300 contacts the sealant 350 formed along the long sides earlier than it contacts the sealant 350 formed along the short sides of the display substrate 110. Therefore, the effect of the filler 300 on the curing of the sealing 350 becomes irregular, and this may cause a defective sealed condition of the organic light emitting diode display 101.

However, in the first exemplary embodiment, the second spacers 320 arranged in parallel with the short sides of the display substrate 110 are longer in the dropping area DA than in the spreading area SA, and the first spacers 310 have the same length in the spreading area SA and the dropping area DA. Therefore, in the spreading area SA, the spreading of the filler 300 in a direction (x-axis direction) parallel to the long sides of the display substrate 110 is more dominant than the spreading of the filler 300 in a direction (y-axis direction) parallel to the short sides thereof. Here, the direction parallel to the long sides of the display substrate 110 refers to a direction facing the short sides of the display substrate 110, and the direction parallel to the short sides of the display substrate 110 refers to a direction facing the long sides of the display substrate 110. Herein, it is possible to reduce a difference between the times taken for the filler 300 starting to be dropped first in the dropping area DA and spread out to reach the long sides and short sides, respectively, of the display substrate 110. In other words, it is possible to reduce a deviation between the times taken for the filler 300 starting to be dropped first in the dropping area DA to contact the sealant 350 formed on the short sides of the display substrate 110 and the sealant 350 formed along the long sides of the sealant 350, respectively.

By this configuration, the organic light emitting diode display 101 can stably improve durability against impact and suppress the generation of a defective sealed condition more effectively.

Moreover, in the organic light emitting diode display 101 according to the first exemplary embodiment, the first spacers 310 and the second spacers 320 serve to prevent the display substrate 110 and the encapsulation substrate 210 from contacting each other. Therefore, the first spacers 310 and the second spacers 320 have a height that is appropriate for the display substrate 110 and the encapsulation substrate 210 to maintain a stable gap. In the first exemplary embodiment, the sum of the height of the first spacers 310 and the height of the second spacers 320 is equal to the gap between the display substrate 110 and the encapsulation substrate 210, as illustrated in FIG. 1. However, the first exemplary embodiment is not limited thereto.

Hereinafter, a method for manufacturing the organic light emitting diode display 101 according to the first exemplary embodiment will be described with reference to FIG. 3.

Figure 3:
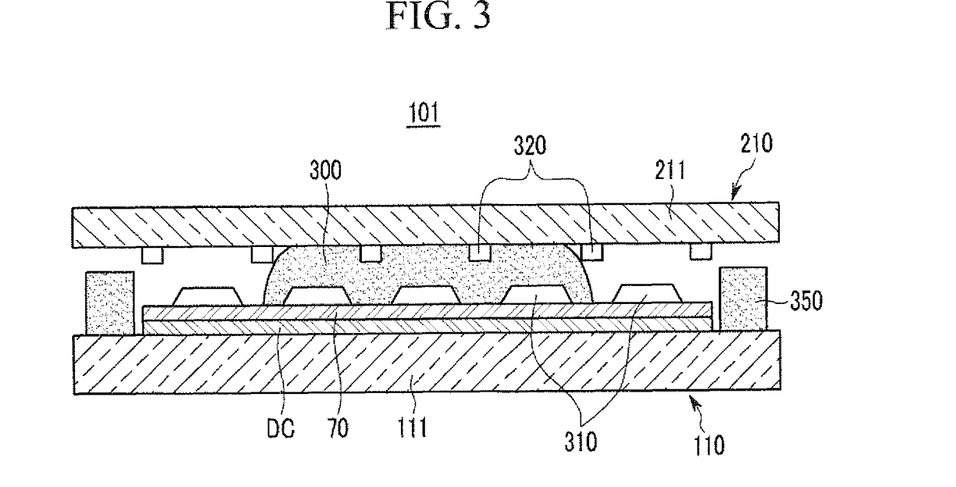
FIG. 3 is a cross-sectional view showing a part of a manufacturing process of the organic light emitting diode display of FIG. 1.

FIG. 3 is a cross-sectional view showing a part of a manufacturing process of the organic light emitting diode display of FIG. 1.

Initially, first spacers 310 are formed on a display substrate 110, and second spacers 320 are formed on an encapsulation substrate 210. The first spacers 310 and the second spacers 320 are formed as a bar type that have a length in a direction parallel to the display substrate 110 and the encapsulation substrate 210, respectively. In addition, the first spacers 310 and the second spacers 320 are arranged in a direction crossing each other when the display substrate 110 and the encapsulation substrate 210 are bonded together.

Concretely, when the display substrate 110 and the encapsulation substrate 210 are bonded together, the first spacers 310 are arranged in parallel with the short sides of pixels, i.e., the short sides of openings 199 of a pixel defining film 190 (shown in FIG. 2), and the second spacers 320 are arranged in parallel with the long sides of the pixels, i.e., the long sides of the openings 199 of the pixel defining film 190. At this time, the first spacers 310 have a length that is less than or equal to that of the short sides of the pixels, and the second spacers 320 have a length that is less than or equal to that of the long sides of the pixels.

In addition, the display substrate 110 and the encapsulation substrate 210 are divided into a dropping area DA and a spreading area SA surrounding the dropping area DA. Further, the second spacers 320 are formed so as to be longer in the dropping area DA than in the spreading area SA.

Next, a sealant 350 is formed on the display substrate 110 along an edge of the display substrate 110. The sealant 350 is disposed so as to be close to the spreading area SA. The sealant 350 is not necessarily formed on the display substrate 110, but may be formed on the encapsulation substrate 210.

Next, as shown in FIG. 3, a filler 300 is first dropped in the dropping area DA, and then the filler 300 is spread out to the edges of both substrates 110 and 210 while bonding the display substrate 110 and the encapsulation substrate 210 together. At this time, the first spacers 310 and second spacers 320 positioned in the dropping area DA serve as a dam for controlling the spreading of the filler 300. That is, the filler 300 is delayed from contacting the sealant 350 as much as possible by the first spacers 310 and second spacers 320 positioned in the dropping area DA.

Conversely, the second spacers 322 of the spreading area SA are shorter than the second spacers 321 of the dropping area DA, and this allows the filler 300 to be spread smoothly in the spreading area SA.

In this manner, the first spacers 310 and second spacers 320 of the dropping area DA suppress the filler 300 from contacting the sealant 350 too quickly, thereby minimizing a negative effect of the filler 300 on the curing process of the sealant 350.

In addition, the second spacers 322 of the spreading area SA have a length that is smaller than that of the second spacers 321 of the dropping area DA, and the first spacers 310 of the spreading area SA and the first spacers 310 of the dropping area DA have the same length. Therefore, in the spreading area SA, the spreading of the filler 300 in a direction (x-axis direction) parallel to the long sides of the display substrate 110 is more dominant than the spreading of the filler 300 in a direction (y-axis direction) parallel to the short sides thereof. Therefore, it is possible to reduce a deviation between the times that it takes for the filler 300 starting to be dropped first in the dropping area DA to contact the sealant 350 formed on the short sides of the display substrate 110 and the sealant 350 formed along the long sides of the sealant 350, respectively.

Next, the sealant 350 is cured in a state in which the display substrate 110 and the encapsulation substrate 210 are bonded together by a vacuum bonding method, with the sealant 350 and the filler 300 interposed therebetween, to thereby completely seal the gap between the display substrate 110 and the encapsulation substrate 210.

By this manufacturing method, the organic light emitting diode display 101 can stably improve durability against impact and suppress the generation of a defective sealed condition more effectively.

Hereinafter, an internal structure of the organic light emitting diode display 101 will be described in detail with reference to FIGS. 4 and 5.

FIG. 4 is an enlarged layout view showing an internal structure of the organic light emitting diode display of FIG. 1, and FIG. 5 is a cross-sectional view taken along line V-V of FIG. 4.

As shown in FIGS. 4 and 5, the display substrate 110 includes a switching thin film transistor 10, a driving thin film transistor 20, a capacitor element 80, and an organic light emitting diode (OLED) 70 that are formed for each pixel. Here, a configuration which includes the switching thin film transistor 10, the driving thin film transistor 20, and the capacitor element 80 is referred to as a driving circuit DC. The display substrate 110 further includes a gate line 151 disposed along one direction, a data line 171 insulated from and crossing the gate line 151, and a common power supply line 172. Here, one pixel may be defined by the gate line 151, the data line 171, and the common power supply line 172, but it is not limited thereto.

The organic light emitting element 70 includes a pixel electrode 710, an organic light emission layer 720 formed on the pixel electrode 710, and a common electrode 730 formed on the organic light emission layer 720. Here, the pixel electrode 710 is an anode (+) electrode which is a hole injection electrode, and the common electrode 730 is a cathode (−) electrode which is an electron injection electrode. However, the first exemplary embodiment is not necessarily limited thereto, and the pixel electrode 710 may be a cathode electrode and the common electrode 730 may be an anode electrode according to a driving method of the organic light emitting diode display 101. Holes and electrons are respectively injected from the pixel electrode 710 and the common electrode 730 into the organic light emission layer 720. When excitons formed by combining the injected holes and electrons fall from an excited state to a ground state, they emit light.

Further, in the organic light emitting diode display 101 according to the first embodiment, the organic light emitting element 70 emits light in the direction of the encapsulation substrate 210. That is, the organic light emitting element 70 is of a front emission type. Here, in order for the organic light emitting element 70 to emit light in the direction of the encapsulation substrate 210, a reflection-type electrode is used as the pixel electrode 710 and a transmission-type or semi-transmission-type electrode is used as the common electrode 730. However, in the first exemplary embodiment, the organic light emitting diode display 101 is not limited to the front emission type. Accordingly, the organic light emitting diode display 101 may be of a rear emission type or a both-direction emission type.

The capacitor element 80 includes a pair of capacitor plates 158 and 178 disposed with an interlayer insulating layer 160 interposed therebetween. Here, the interlayer insulating layer 160 is made of a dielectric material. The capacitance is determined by an electric charge stored in the capacitor element 80 and a voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element to select a pixel to emit light. The switching gate electrode 152 is connected to the gate line 151. The switching source electrode 173 is connected to the data line 171. The switching drain electrode 174 is spaced apart from the switching source electrode 173 and connected to the capacitor plate 158.

The driving thin film transistor 20 applies driving power to the pixel electrode 710 for allowing the organic light emission layer 720 of the organic light emitting element 70 in a selected pixel to emit light. The driving gate electrode 155 is connected to the capacitor plate 158 connected to the switching drain electrode 174. The driving source electrode 176 and the other capacitor plate 178 are respectively connected to the common power supply line 172. The driving drain electrode 177 is connected to the pixel electrode 710 of the organic light emitting element 70 via a contact hole 182.

By this structure, the switching thin film transistor 10 is operated by a gate voltage applied to the gate line 151, and serves to transmit a data voltage applied to the data line 171 to the driving thin film transistor 20. A voltage corresponding to the difference between a common voltage applied to the driving thin film transistor 20 from the common power supply line 172 and the data voltage transmitted from the switching thin film transistor 10 is stored in the capacitor element 80, and a current corresponding to the voltage stored in the capacitor element 80 flows to the organic light emitting element 70 through the driving thin film transistor 20 to thus make the organic light emitting element 70 emit light.

As shown in FIG. 5, an encapsulation substrate 210 is disposed on the organic light emitting element 70 to protect the organic light emitting element 70.

Hereinafter, a second exemplary embodiment will be described with reference to FIG. 6.

Figure 6:
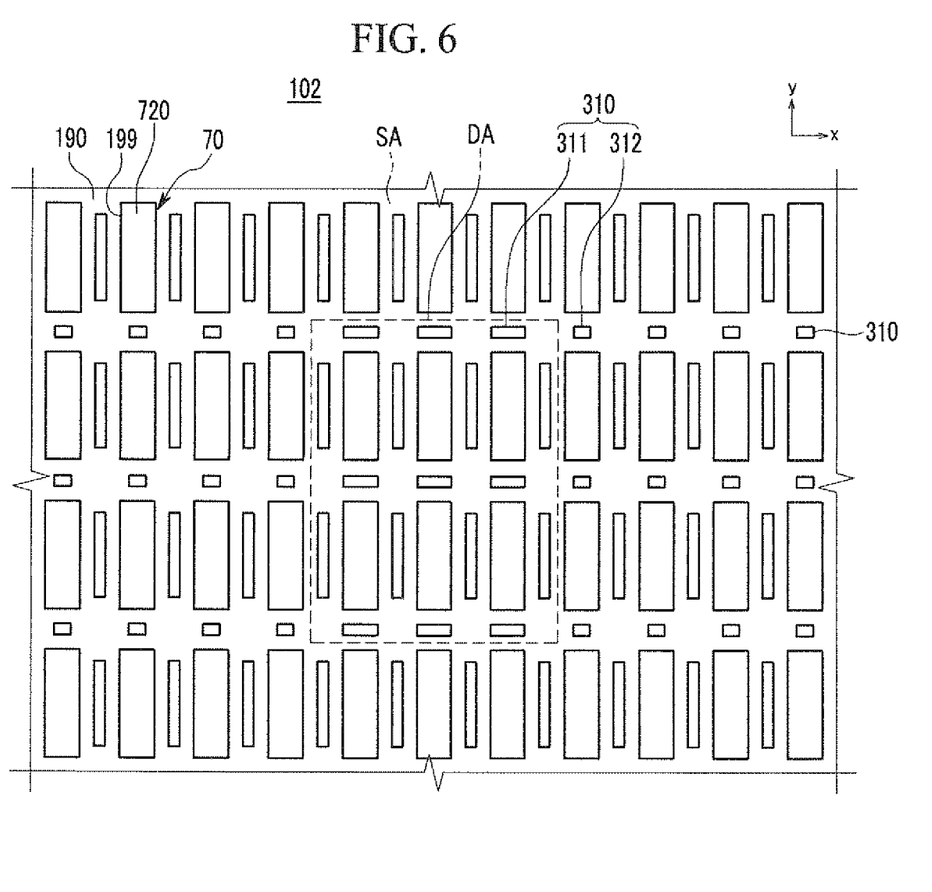
FIG. 6 is a plan view of an organic light emitting diode display according to a second exemplary embodiment.

FIG. 6 is a plan view of an organic light emitting diode display according to a second exemplary embodiment.

As shown in FIG. 6, in the organic light emitting diode display 102 according to the second exemplary embodiment, the length of the first spacers 310 in a direction parallel to the display substrate 110 is larger in the dropping area DA than in the spreading area SA. That is, the first spacers 311 of the dropping area DA are longer than the first spacers 312 of the spreading area SA, and the second spacers 320 have the same length in the spreading area SA and in the dropping area DA.

By this configuration, the organic light emitting diode display 102 can stably improve durability against impact and suppress the generation of a defective sealed condition more effectively.

Further, the method for manufacturing the organic light emitting diode display 102 according to the second exemplary embodiment is the same as the method for manufacturing the organic light emitting diode display 101 according to the first exemplary embodiment except that the first spacers 310 are longer in the dropping area DA than in the spreading area SA, and the second spacers 320 have the same length in the spreading area SA and in the dropping area DA.

Hereinafter, a third exemplary embodiment will be described with reference to FIG. 7.

Figure 7:
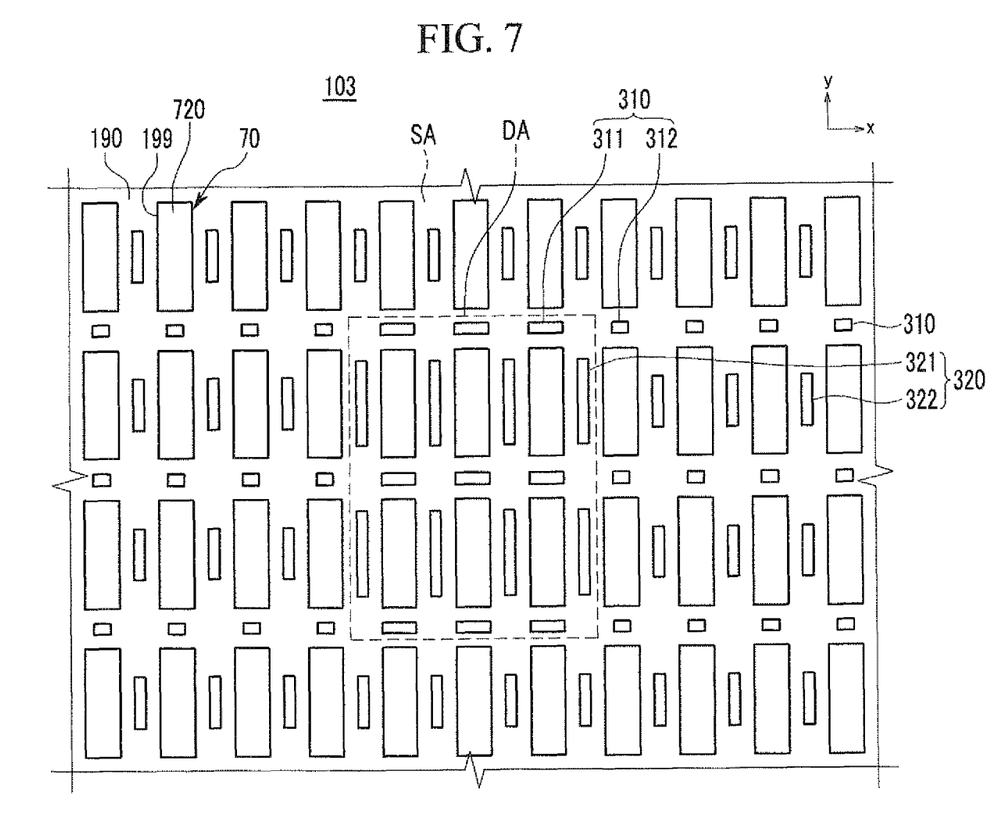
FIG. 7 is a plan view of an organic light emitting diode display according to a third exemplary embodiment.

FIG. 7 is a plan view of an organic light emitting diode display according to a third exemplary embodiment.

As shown in FIG. 7, in the organic light emitting diode display 103 according to the third exemplary embodiment, the lengths of the first spacers 310 and the second spacers 320 in a direction parallel to the display substrate 110 and the encapsulation substrate 210, respectively, are larger in the dropping area DA than in the spreading area SA.

That is, the first spacers 311 of the dropping area DA are longer than the first spacers 312 of the spreading area SA, and the second spacers 321 of the dropping area DA are longer than the second spacers 322 of the spreading area SA.

By this configuration, the organic light emitting diode display 103 can stably improve durability against impact and suppress the generation of a defective sealed condition more effectively.

Also, the method for manufacturing the organic light emitting diode display 103 according to the third exemplary embodiment is the same as the method for manufacturing the organic light emitting diode display 101 according to the first exemplary embodiment, except that both the first spacers 310 and the second spacers 320 are longer in the dropping area DA than in the spreading area SA.

Hereinafter, a fourth exemplary embodiment will be described with reference to FIG. 8.

Figure 8:
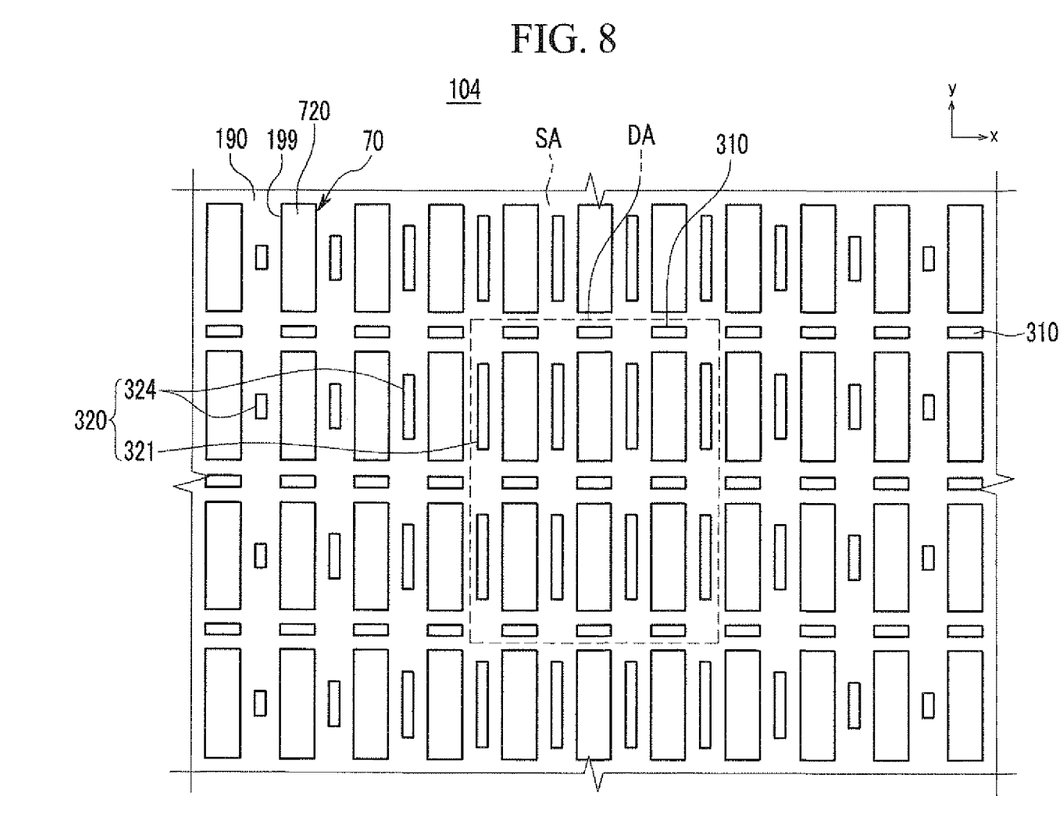
FIG. 8 is a plan view of an organic light emitting diode display according to a fourth exemplary embodiment.

FIG. 8 is a plan view of an organic light emitting diode display according to a fourth exemplary embodiment.

As shown in FIG. 8, either or both of the first spacers 310 and the second spacers 320 become gradually shorter toward the spreading area SA from the dropping area DA.

In FIG. 8, the length of the second spacers 321 in a direction parallel to the encapsulation substrate 210 is larger in the dropping area DA than in the spreading area SA, and the second spacers 320 of the spreading area SA become gradually shorter from the dropping area DA. That is, the second spacers 321 of the dropping area DA are the longest, and the second spacers 324 of the spreading area SA become gradually shorter from the dropping area DA. However, the present invention is not limited thereto. Accordingly, the first spacers 310 may be longer in the dropping area DA than in the spreading area SA, and the first spacers 310 of the spreading area SA may become gradually shorter from the dropping area DA. Also, both of the first spacers 310 and the second spacers 320 may become gradually shorter toward the spreading area SA from the dropping area DA.

By this configuration, the organic light emitting diode display 104 can stably improve durability against impact and suppress the generation of a defective sealed condition more effectively.

Also, the method for manufacturing the organic light emitting diode display 104 according to the fourth exemplary embodiment is the same as the method for manufacturing the organic light emitting diode display 101 according to the first exemplary embodiment, except that either or both the first spacers 310 and the second spacers 320 become gradually shorter toward the spreading area SA from the dropping area DA.

Hereinafter, a fifth exemplary embodiment will be described with reference to FIG. 9.

Figure 9:
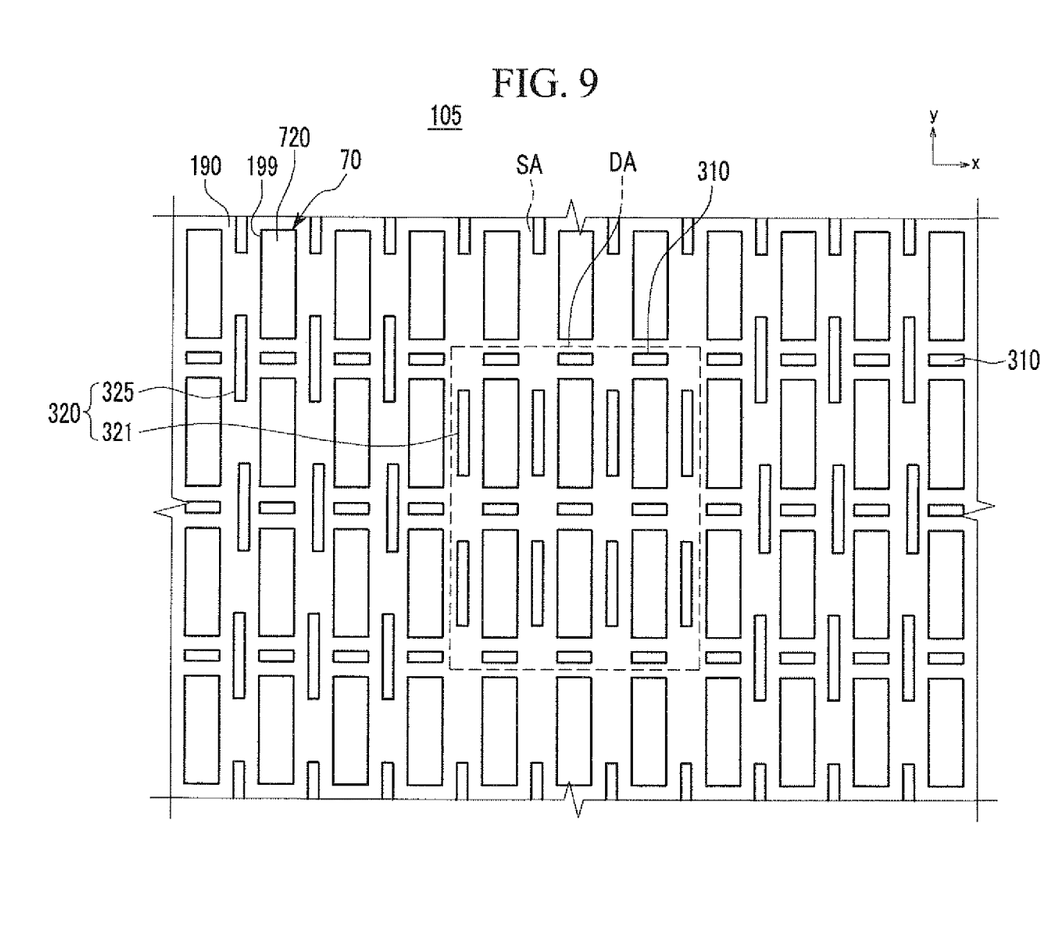
FIG. 9 is a plan view of an organic light emitting diode display according to a fifth exemplary embodiment.

FIG. 9 is a plan view of an organic light emitting diode display according to a fifth exemplary embodiment.

As shown in FIG. 9, a pair of first spacers 310 and a pair of second spacers 321 are arranged in a rectangular shape in the dropping area DA of an organic light emitting diode display 105 according to the fifth exemplary embodiment, and the middle portion of a second spacer 325 is positioned between a pair of the first spacers 310 neighboring in a longitudinal direction in the spreading area SA.

That is, while the first spacers 310 and the second spacers 321 in the dropping area DA serve as a dam for controlling the flow of a filler, the second spacers 325 in the spreading area SA have an open structure so as to facilitate the flow of the filler.

Therefore, in the spreading area SA, the spreading of the filler 300 in a direction (x-axis direction) parallel to the long sides of the display substrate 110 is more dominant than the spreading of the filler 300 in a direction (y-axis direction) parallel to the short sides thereof. Herein, it is possible to reduce a difference between the times that it takes for the filler 300 starting to be dropped first in the dropping area DA and spread out to reach the long sides and short sides, respectively, of the display substrate 110. In other words, it is possible to reduce a deviation between the times that it takes for the filler 300 starting to be dropped first in the dropping area DA to contact the sealant 350 formed on the short sides of the display substrate 110 and the sealant 350 formed along the long sides of the sealant 350, respectively.

Additionally, by this configuration, the organic light emitting diode display 104 can stably improve durability against impact and suppress the generation of a defective sealed condition more effectively.

Also, the method for manufacturing the organic light emitting diode display 105 according to the fifth exemplary embodiment is the same as the method for manufacturing the organic light emitting diode display 101 according to the first exemplary embodiment, except that the middle portion of the second spacer 325 is positioned between a pair of the first spacers 310 neighboring in a longitudinal direction in the spreading area SA.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. A method for manufacturing an organic light emitting diode display device, comprising the steps of:
   forming first spacers on a display substrate;
   forming second spacers on an encapsulation substrate;
   dividing the display substrate and the encapsulation substrate into a dropping area and a spreading area;
   forming a sealant on edges of at least one of the display substrate and the encapsulation substrate;
   dropping a filler in the dropping area on any one of the display substrate and the encapsulation substrate so as to spread out to the spreading area; and
   bonding the display substrate and the encapsulation substrate together with the sealant and the filler interposed therebetween;
   wherein at least one of the first spacers and the second spacers is provided with a shape in the dropping area which is different from a shape of said at least one of the first spacers and the second spacers in the spreading area.

2. The method of claim 1, further comprising the steps of;
   forming each of the first spacers and the second spacers as a bar type with a length in a direction parallel to the display substrate and the encapsulation substrate, respectively, and
   arranging the first spacers and the second spacers in directions crossing each other.

3. The method of claim 1, wherein the second spacers are longer in the dropping area than in the spreading area.

4. The method of claim 1, wherein the first spacers are longer in the dropping area than in the spreading area.

5. The method of claim 1, wherein the first spacers and the second spacers are longer in the dropping area than in the spreading area.

6. The method of claim 1, wherein at least one of the first spacers and the second spacers formed in the spreading area become gradually shorter from the dropping area.

7. The method of claim 1, wherein a pair of first spacers and a pair of second spacers are arranged in a rectangular shape in the dropping area, and a middle portion of the second spacer is positioned between a pair of the first spacers neighboring in a longitudinal direction in the spreading area.

8. The method of claim 1, wherein the organic light emitting element of the display substrate displays an image through a plurality of pixels emitting light, and the first spacers are arranged in parallel with short sides of pixels and the second spacers are arranged in parallel with long sides of the pixels.

9. The method of claim 8, wherein the first spacers have a length that is no greater than a length of the short sides of pixels, and the second spacers have a length that is no greater than a length of the long sides of the pixels.

10. The method of claim 1, further comprising the step of curing the sealant in a state in which the display substrate and the encapsulation substrate are bonded together.

* * * * *